United States Patent
Masuda et al.

(10) Patent No.: US 8,901,568 B2
(45) Date of Patent: Dec. 2, 2014

(54) SILICON CARBIDE INSULATING GATE TYPE SEMICONDUCTOR DEVICE AND FABRICATION METHOD THEREOF

(75) Inventors: Takeyoshi Masuda, Osaka (JP); Keiji Wada, Osaka (JP); Misako Honaga, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 454 days.

(21) Appl. No.: 13/381,605

(22) PCT Filed: Feb. 7, 2011

(86) PCT No.: PCT/JP2011/052531
§ 371 (c)(1),
(2), (4) Date: Dec. 29, 2011

(87) PCT Pub. No.: WO2011/102254
PCT Pub. Date: Aug. 25, 2011

(65) Prior Publication Data
US 2012/0097980 A1    Apr. 26, 2012

(30) Foreign Application Priority Data

Feb. 16, 2010    (JP) .................................. 2010-031507

(51) Int. Cl.
| | | |
|---|---|---|
| H01L 29/24 | (2006.01) | |
| H01L 29/78 | (2006.01) | |
| H01L 29/06 | (2006.01) | |
| H01L 29/66 | (2006.01) | |
| H01L 29/10 | (2006.01) | |
| H01L 29/16 | (2006.01) | |
| H01L 29/417 | (2006.01) | |
| H01L 29/423 | (2006.01) | |

(52) U.S. Cl.
CPC ......... *H01L 29/7811* (2013.01); *H01L 29/1608* (2013.01); *H01L 29/41741* (2013.01); *H01L 29/0615* (2013.01); *H01L 29/66068* (2013.01); *H01L 29/1095* (2013.01); *H01L 29/42372* (2013.01); *H01L 29/0619* (2013.01); *H01L 29/0696* (2013.01)
USPC ...................................... 257/77; 257/E29.104

(58) Field of Classification Search
USPC ............................................. 257/77, E29.104
See application file for complete search history.

(56) References Cited

U.S. PATENT DOCUMENTS

| | | |
|---|---|---|
| 2008/0001159 A1 | 1/2008 | Ota et al. |
| 2008/0315297 A1 | 12/2008 | Takashita et al. |
| 2009/0302376 A1 | 12/2009 | Inoue et al. |

FOREIGN PATENT DOCUMENTS

| | | |
|---|---|---|
| CN | 101097947 A | 1/2008 |
| JP | 62-173764 A | 7/1987 |

(Continued)

OTHER PUBLICATIONS

Office Action in Chinese Patent Application No. 201180003503.9, dated Jan. 24, 2014.

*Primary Examiner* — Matthew Reames
(74) *Attorney, Agent, or Firm* — Venable LLP; Michael A. Sartori

(57) ABSTRACT

A termination configuration of a silicon carbide insulating gate type semiconductor device includes a semiconductor layer of a first conductivity type having a first main face, a gate electrode, and a source interconnection, as well as a circumferential resurf region. The semiconductor layer includes a body region of a second conductivity type, a source region of the first conductivity type, a contact region of the second conductivity type, and a circumferential resurf region of the second conductivity type. A width of a portion of the circumferential resurf region excluding the body region is greater than or equal to ½ the thickness of at least the semiconductor layer. A silicon carbide insulating gate type semiconductor device of high breakdown voltage and high performance can be provided.

14 Claims, 13 Drawing Sheets

(56) References Cited

FOREIGN PATENT DOCUMENTS

| | | | |
|---|---|---|---|
| JP | 1-292862 A | 11/1989 |
| JP | 4-159776 A | 6/1992 |
| JP | 7-240518 A | 9/1995 |
| JP | 10-261787 A | 9/1998 |
| JP | 2003078138 A | 3/2003 |
| JP | 3498459 | 2/2004 |
| JP | 2004-158844 A | 6/2004 |
| JP | 2009004668 A | 1/2009 |
| JP | 2009-289904 A | 12/2009 |

SILICON CARBIDE INSULATING GATE TYPE SEMICONDUCTOR DEVICE AND FABRICATION METHOD THEREOF

TECHNICAL FIELD

The present invention relates to an insulating gate type semiconductor device employing silicon carbide (SiC) as the semiconductor material, and a method of fabricating an insulating gate type semiconductor device.

BACKGROUND ART

Recently, SiC is attracting attention as the semiconductor material for the next generation. SiC has a dielectric breakdown field of 6 MV/cm that is approximately one order of magnitude greater than that of silicon (Si). This high dielectric breakdown property of SiC may provide favorable characteristics for a semiconductor device that could not be realized with Si type semiconductor devices that are the present mainstream. Particularly the high breakdown voltage and low loss of SiC semiconductor devices lead to the strong demand for practical use of realizing power conversion devices such as small and highly-efficient inverters and converters in the field of electric power, trains, vehicles, electrical appliance and the like.

As such a SiC semiconductor device, there is proposed an insulating gate type semiconductor device, particularly a vertical MOSFET (MOS Field Effect Transistor; metal-oxide film-semiconductor field effect transistor) of the DMOS (Double Diffused Metal Oxide Semiconductor) structure (refer to U.S. Pat. No. 3,498,459 (Patent Literature 1)). According to Patent Literature 1, the vertical MOSFET includes a p base (body) region, an $n^+$ source region, and an $n^+$ drain region made of silicon carbide; a gate insulating film formed at the surface of the p base region, a gate electrode provided on the gate insulating film, and two main electrodes for current flow. The current between the main electrodes is controlled by applying positive voltage to the gate electrode and adjusting the concentration of electrons in the inversion layer induced at the surface layer of the p base region located below the gate insulating film.

CITATION LIST

Patent Literature

PTL 1: Japanese Patent No. 3498459

SUMMARY OF INVENTION

Technical Problem

A vertical type MOSFET device of the DMOS structure is formed of a plurality of basic cells, each functioning as a MOSFET of the DMOS structure. Adjacent basic cells are arranged so as to form contact at the boundary. Basic cells in the device surrounded by basic cells affect each other and exhibit the same behavior. However the basic cell located at the outermost circumference (termination section) receives a different effect from the surrounding, so that its behavior differs from that of an interior basic cell. Particularly, the electric field is concentrated at a portion of the base (body) region in an OFF state where current between the main electrodes does not flow, leading to the problem of degradation in the breakdown voltage of the device. In view of such a problem occurring at the termination section configuration, the configuration of the termination section was evaluated and optimized to realize a silicon carbide insulating gate type semiconductor device of the present invention having high breakdown voltage and high performance.

Solution to Problem

A silicon carbide insulating gate type semiconductor device of the present invention includes a semiconductor layer of a first conductivity type formed on a substrate, and having a first main face opposite to a side of a face in contact with the substrate, and an electrode and interconnection formed on the first main face. The semiconductor layer includes an active region formed so as to include the first main face, and a circumferential resurf region formed in a strip so as to surround the circumference of the active region and to include the first main face. In the active region, a plurality of basic cells surrounded by an imaginary boundary line constituting a polygon in plan view are arranged with no gap so as to form contact at the boundary line. Each of the plurality of basic cells has a body region of a second conductivity type constituting substantially an analogue to the polygon at the main face. The circumferential resurf region is of the second conductivity type, formed to include the body region in the basic cells constituting the outermost circumference of the active region. The width of a portion of the circumferential resurf region, excluding the body region, is greater than or equal to ½ the thickness of at least the semiconductor layer.

According to the present invention, the circumferential resurf region serves to alleviate the electric field concentrated at a portion of the body region located at the outermost circumference, allowing the breakdown voltage of the silicon carbide insulating gate type semiconductor device to be improved.

The average impurity concentration of the second conductivity type circumferential resurf region is preferably higher than, more preferably greater than or equal to three times, the average impurity concentration of the second conductivity type body region, at the surface region of the semiconductor layer as far as a depth of 0.05 μm from the first main face.

The average impurity concentration of the surface region in the body region closely relates to the electric property such as the threshold voltage and channel mobility of the silicon carbide insulating gate type semiconductor device, and is in the vicinity of $1 \times 10^{16}$ $cm^{-3}$, particularly approximately $2 \times 10^{16}$ $cm^{-3}$. If the average impurity concentration of the surface region in the circumferential resurf region is lower than the average impurity concentration of the surface region in the body region, the surface layer in the body region will be depleted when the silicon carbide insulating gate type semiconductor device is in an OFF state, rendering the transition of the silicon carbide insulating gate type semiconductor device to an ON state unstable. By setting the average impurity concentration of the surface region in the circumferential resurf region higher than that of the body region, the introduction of a depletion layer to the surface region in the body region is prevented, allowing stable transition to an ON state.

The body region has an impurity concentration distribution of the second conductivity type with a maximal value in the depth direction from the first main face. At the depth corresponding to the maximal value in the body region, the impurity concentration of the second conductivity type in the circumferential resurf region is preferably less than or equal to ⅓ the maximal value of the impurity concentration of second conductivity type in the body region. Further, the depth of the circumferential resurf region from the first main face is preferably greater than the depth of the body region from the first main face.

Accordingly, concentration of the electric field at a portion of the body region no longer occurs. The circumferential resurf region functions sufficiently as an electric field alleviation layer, leading to improvement of the breakdown voltage of the silicon carbide insulating gate type semiconductor device.

The circumferential resurf region is of the p type conductivity, preferably including boron for the impurity species. In the case of silicon carbide, aluminum and boron can be cited as p type impurities. Boron has an ion implantation range greater than that of aluminum, allowing the formation of a deeper impurity region.

The outer circumference of the circumferential resurf region taking a strip shape in plan view constitutes a chamfered quadrangle having the four corners rounded. The radius of the circumferential chamfered section is preferably greater than or equal to the thickness of the drift semiconductor layer. By rounding the four circumferential corners, electric field concentration is alleviated, allowing the breakdown voltage of the insulating gate field semiconductor element to be further improved.

At least one or more guard ring having conductivity of the second type identical to that of the circumferential resurf region is preferably provided so as to surround the circumferential resurf region. Since the guard ring serves to alleviate the electric field, the breakdown voltage of the silicon carbide insulating gate type semiconductor device can be further improved.

A strip-like gate liner interconnection made of metal is arranged on the circumferential resurf region with an insulating film thereunder. Preferably, the gate liner interconnection is electrically connected to all the gate electrodes of the basic cells located at the outermost circumference. By the electrical connection between the gate liner interconnection and all the gate electrodes at the outermost circumference, the gate resistance as the silicon carbide insulating gate type semiconductor device can be reduced, allowing an operation at high frequency.

Substantially right below the gate electrode located at the overlapping region between the basic cell of the outermost circumference and the circumferential resurf region in plan view, an anti-inversion region having an impurity concentration higher than that of the body region is preferably formed so as to include the first main face. The anti-inversion region has conductivity of the second type. The impurity concentration thereof is preferably equal to the impurity concentration of the second conductivity type contact region. By providing the above-described anti-inversion region, formation of an inversion layer at the semiconductor layer surface substantially right below the gate electrode is less likely to occur, allowing the breakdown voltage of the silicon carbide insulating gate type semiconductor device to be improved.

The shape of the basic cell set forth above is preferably a hexagon in plan view. By this hexagon shape in plan view, the body region formed in the basic cell similarly takes an analogue hexagon. Since each vertex angle of the body region will take an obtuse angle, the electric field concentration can be reduced, allowing the breakdown voltage of the silicon carbide insulating gate type semiconductor device to be improved.

The first main face is preferably inclined greater than or equal to 50° and less than or equal to 65° relative to the [0001] plane. Particularly, the first main face is preferably the [03-38] plane. By setting the plane orientation of the first main face where an inversion layer is formed in the case where silicon carbide is employed, the mobility of electrons in the inversion layer can be increased, allowing a silicon carbide insulating gate type semiconductor device of low loss to be realized.

A method of fabricating a silicon carbide insulating gate type semiconductor device includes the steps of preparing a substrate, forming a mask member for ion implantation at the substrate, processing the mask member to a predetermined shape by photolithography, and performing ion implantation with the mask member as a mask. Preferably, the circumferential resurf region and guard ring are formed simultaneously. Simultaneous formation of the circumferential resurf region and guard ring allows the fabrication steps of the silicon carbide insulating gate type semiconductor device to be simplified.

A method of fabricating a silicon carbide insulating gate type semiconductor device includes the steps of preparing a substrate, forming a mask member for ion implantation at the substrate, processing the mask member to a predetermined shape by photolithography, and performing ion implantation with the mask member as a mask. Preferably, the contact region and anti-inversion region are formed simultaneously. Simultaneous formation of the contact region and anti-inversion region allows the fabrication steps of the silicon carbide insulating gate type semiconductor device to be simplified.

Advantageous Effects of Invention

According to the silicon carbide insulating gate type semiconductor device of the present invention set forth above, high breakdown voltage and high performance are allowed for a semiconductor device.

DESCRIPTION OF EMBODIMENTS

First Embodiment

Figure 1:
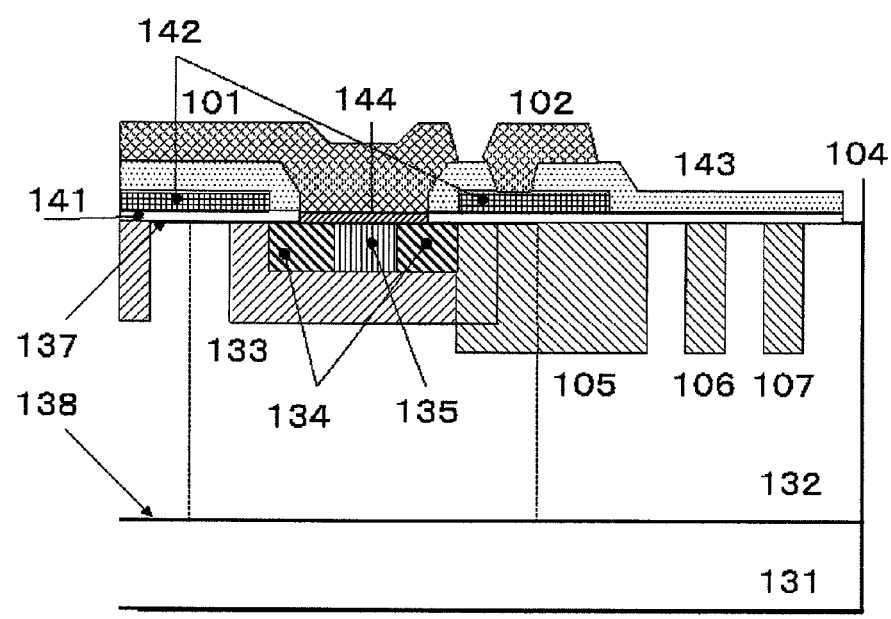
FIG. 1 represents a cross-sectional configuration of a termination section of a silicon carbide insulating gate type semiconductor device.

A first embodiment of the present invention will be described in detail hereinafter with reference to the drawings. In the drawings, the same or corresponding elements have the same reference characters allotted, and description thereof will not be repeated.

A cross-sectional configuration of a termination section (the section of line I-I shown in FIGS. 3A and 3B described afterwards) of a silicon carbide insulating gate type semiconductor device 100 according to the first embodiment of the present invention is shown in FIG. 1. Referring to FIG. 1, the insulating gate type semiconductor device according to the present embodiment includes a substrate 131 (support substrate), a semiconductor layer 132, a gate oxide film 141, a gate electrode 142, an interlayer insulating film 143, an ohmic electrode 144, a source interconnection 101, and a gate liner interconnection 102. Semiconductor layer 132 has a first main face 137 and a second main face 138, opposite to each other. Second main face 138 is in contact with substrate 131. Semiconductor layer 132 includes a body region 133, a source region 134, a contact region 135, a circumferential resurf region 105, and guard rings 106 and 107, all formed including first main face 137.

Substrate 131 is formed of hexagonal silicon carbide (SiC) having, for example, a polytype of 4H. Substrate 131 has conductivity of $n^+$ type, and the thickness is approximately 400 μm. Although not shown in FIG. 1, a drain electrode is formed on the main face of the substrate opposite to the main face in contact with semiconductor layer 132. In order to achieve low loss for silicon carbide insulating gate type semiconductor device 100, low resistance is desired for substrate 131. Substrate 131 has an impurity concentration in the range of $5 \times 10^{18}$ cm$^{-3}$ to $6 \times 10^{19}$ cm$^{-3}$, and a resistivity of approximately 0.5 to 2 mΩ·cm. Nitrogen is typical of an n type impurity. Although the resistance will become lower as the impurity concentration becomes higher, crystallinity will be degraded if the impurity concentration exceeds $6 \times 10^{19}$ cm$^{-3}$. The main face of the substrate in contact with second main face 138 of semiconductor layer 132 has a plane orientation {0001}. More preferably, the off angle relative to plane orientation {0001} is greater than or equal to 50° and less than or equal to 65°. For example, plane orientation {03-38} is preferable. In the case where the main face of substrate 131 is in the vicinity of plane orientation {03-38}, the plane orientation of first main face 137 of semiconductor layer 132 can be set to be in the vicinity of {03-38} by forming semiconductor layer 132 on substrate 131 by homoepitaxial growth.

Semiconductor layer 132 is a SiC layer formed on substrate 131 by epitaxial growth. Semiconductor layer 132 is closely related to the breakdown voltage of silicon carbide insulating gate type semiconductor device 100. For example, when the breakdown voltage of the device is approximately 1 kV, the n type impurity concentration is approximately $5 \times 10^{15}$ cm$^{-3}$, and the thickness is approximately 10 μm. Although first main face 137 may have plane orientation {0001}, first main face 137 preferably has an off greater than or equal to 50° and less than or equal to 65° relative to plane orientation {0001}. For example, first main face 137 has plane orientation {03-38}.

Such a plane orientation for first main face 137 allows the mobility of electrons in the inversion layer formed at channel region 145 in semiconductor layer 132 substantially right below gate electrode 142 that will be described afterwards to be increased. Therefore, silicon carbide insulating gate type semiconductor device 100 is capable of low loss. Although not shown in FIG. 1, semiconductor layer 132 may include a buffer layer having a thickness of approximately 0.5 μm from second main face 138 of semiconductor layer 132, having an n type impurity concentration of approximately $5 \times 10^{17}$ cm$^{-3}$.

Figure 4A:
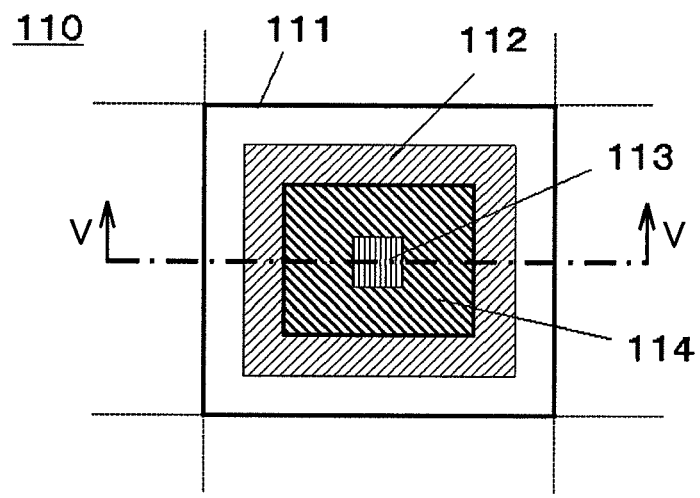
FIG. 4A is a plan view of a first main face of a basic cell configuration of a silicon carbide insulating gate type semiconductor device, corresponding to the case where the basic cell takes a quadrangle shape.
Figure 4B:
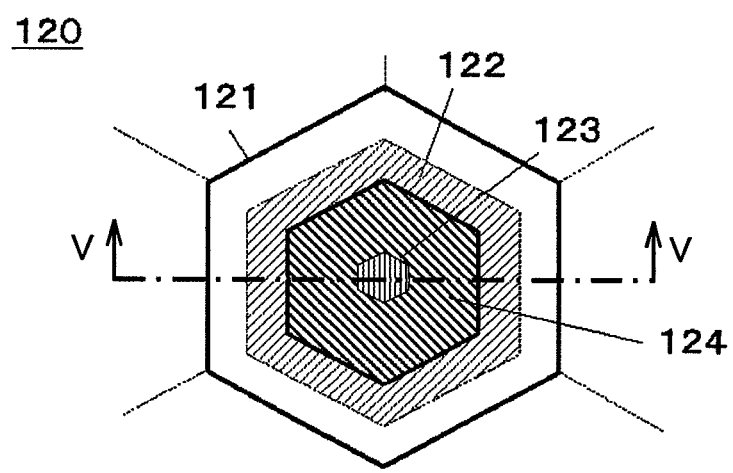
FIG. 4B is a plan view of a first main face of a basic cell configuration of a silicon carbide insulating gate type semiconductor device, corresponding to the case where the basic cell takes a hexagon shape.
Figure 9:
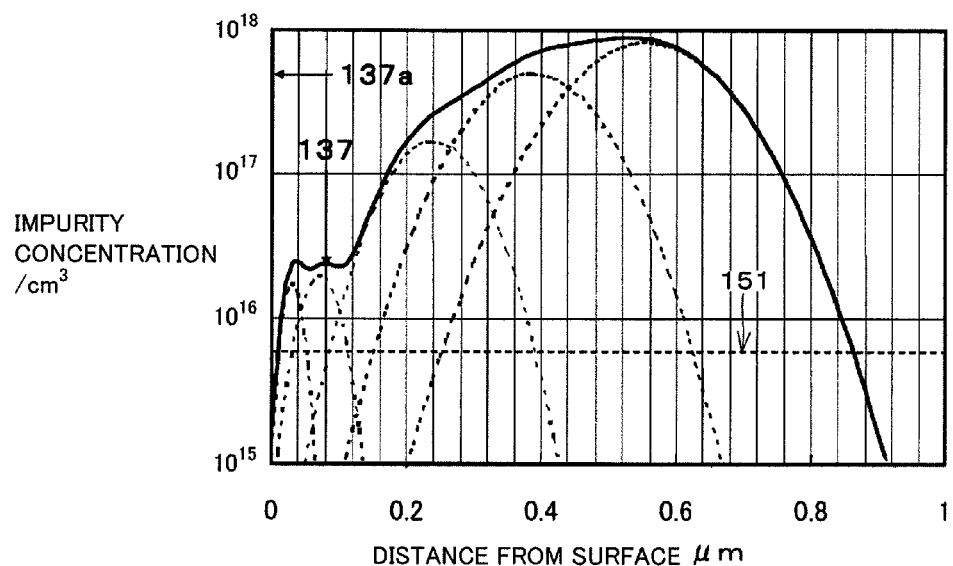
FIG. 9 represents results of impurity distribution in the depth direction calculated by Gaussian approximation in a body region formation step of a silicon carbide insulating gate type semiconductor device.

Body region 133 is formed in semiconductor layer 132 so as to include first main face 137 of semiconductor layer 132 (refer to FIG. 1). FIGS. 4A and 4B represent the plan view of each impurity region on first main face 137 of semiconductor layer 132. FIG. 4A corresponds to the case where a basic cell 110 takes a quadrangle shape in plan view, whereas FIG. 4B corresponds to the case where a basic cell 120 takes a hexagon shape in plan view. Referring to FIGS. 4A and 4B, body region 133 is substantially an analogue to the boundary line (111 or 121) of the basic cell (110 or 120) in plan view, and is formed in a basic cell. As an example of the present embodiment, the ion implantation condition for the formation of body region 133 and the distribution of impurity concentration in the depth direction are shown in FIG. 9 and Table 1, respectively.

TABLE 1

| | First | Second | Third | Fourth | Fifth |
|---|---|---|---|---|---|
| Ion Species | Al | Al | Al | Al | Al |
| Acceleration Voltage (keV) | 35 | 75 | 240 | 400 | 600 |
| Dosage (/cm$^2$) | $6.0 \times 10^{10}$ | $1.3 \times 10^{11}$ | $2.5 \times 10^{12}$ | $1.0 \times 10^{13}$ | $2.0 \times 10^{13}$ |

Table 1 represents first to fifth implantations based on the implantation parameters of implantation species, acceleration voltage (keV) and dosage (atoms/cm$^2$) for the ion implantation conditions. In FIG. 9, the impurity concentration distribution in the depth direction of each implantation (broken line) and of the sum of each implantation (bold solid line) is shown, relative to a depth (μm) taken along the horizontal axis with first main face 137a of semiconductor layer 132 corresponding to the point in time of ion implantation as the origin. In the drawing, the impurity concentration of semiconductor layer 132 is indicated by a dotted straight line 151. First main face 137a of semiconductor layer 132 corresponding to the point in time of ion implantation will be lost by approximately 0.08 μm in an oxidation step that will be described afterwards. Therefore, first main face 137 of the produced silicon carbide insulating gate type semiconductor device 100 is shown in the drawing. With this first main face 137 as the origin in FIG. 9, body region 133 of p type conductivity has an impurity concentration distribution in the depth direction exhibiting an average value in the vicinity of $1 \times 10^{16}$ cm$^3$, particularly approximately $2 \times 10^{16}$ cm$^{-3}$ at the surface region having a depth of 0.05 μm from first main face 137. The maximal value in the vicinity of $1 \times 10^{18}$ cm$^3$ is exhibited at a region deeper than 0.05 From the crossing position between the bold solid line indicating the impurity concentration of the sum of each ion implantation and the dotted straight line 151 indicating the impurity concentration of semiconductor layer 132, the depth of body region 133 is approximately 0.8 μm. Since impurity introduction is mainly conducted by ion implantation and the introduced impurities hardly diffuse in the case of SiC, it is difficult to form a deep impurity region. Therefore, in order to ensure the breakdown voltage of the device, the total amount of p type impurities in body region 133 must be set greater than the total amount of impurities in n⁻ semiconductor layer 132. Furthermore, since a channel region 145 is formed at the surface of body region 133 substantially right below gate electrode 142, the impurity concentration in the proximity of the surface of body region 133 must be reduced. As a result, body region 133 will have an impurity concentration distribution in the depth direction. Boron (B) and aluminum (Al) are typical of p type impurities. Here, Al having a shallow acceptor level is employed. This is because the carrier activation is high with a shallow acceptor level, allowing an insulating gate type semiconductor device 100 of low loss to be realized.

Referring to FIGS. 1, 4A and 4B, source region 134 is of n⁺ type conductivity, and formed in p type body region 133 in plan view, including first main face 137. As an example of the present embodiment, the ion implantation conditions to form source region 134, and the impurity concentration distribution in the depth direction are shown in Table 2 and FIG. 10, respectively.

TABLE 2

| | First | Second | Third |
|---|---|---|---|
| Ion Species | P | P | P |
| Acceleration Voltage (keV) | 90 | 200 | 400 |
| Dosage (/cm$^2$) | $1.0 \times 10^{14}$ | $2.0 \times 10^{14}$ | $4.0 \times 10^{14}$ |

Figure 10:
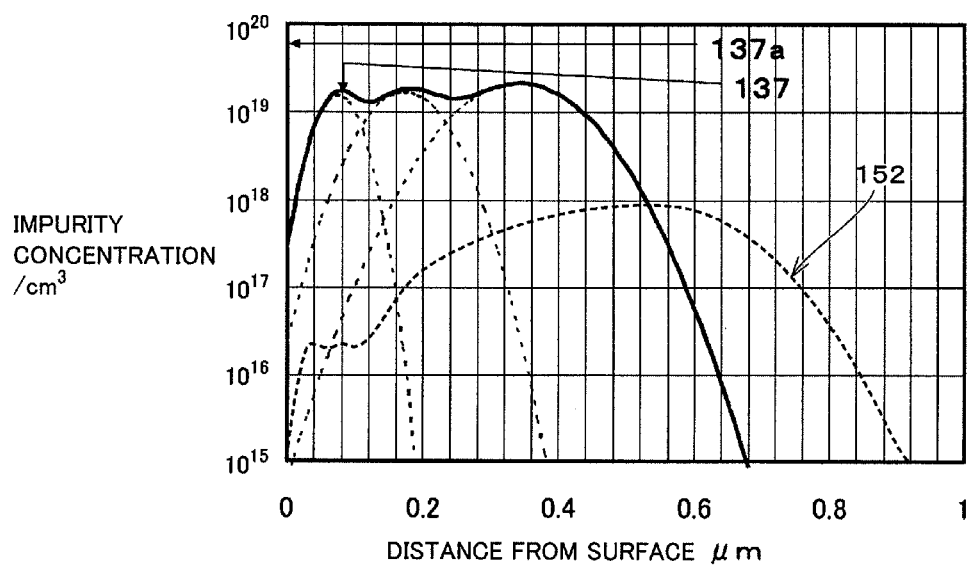
FIG. 10 represents results of impurity distribution in the depth direction calculated by Gaussian approximation in a source region formation step of a silicon carbide insulating gate type semiconductor device.

Table 2 represents first to third implantations based on the implantation parameters of implantation species, acceleration voltage (keV) and dosage (atoms/cm$^2$) for the ion implantation conditions. In FIG. 10, the impurity concentration distribution in the depth direction of each implantation (broken line) and of the sum of each implantation (bold solid line) is shown, relative to a depth (μm) taken along the horizontal axis with first main face 137a of semiconductor layer 132 corresponding to the point in time of ion implantation as the origin. In the drawing, the impurity concentration of body region 133 is indicated by a dotted curve 152. First main face 137a of semiconductor layer 132 corresponding to the point in time of ion implantation will be lost by approximately 0.08 μm in an oxidation step that will be described afterwards. Therefore, first main face 137 of the produced silicon carbide insulating gate type semiconductor device 100 is shown in the drawing. With this first main face 137 as the origin in FIG. 10, the depth from first main face 137 of source region 134 is approximately 0.45 μm, from the crossing position between the bold solid line and the dotted curve 152. In order to obtain favorable ohmic contact for source region 134, the impurity concentration of the surface region including first main face 137 is greater than or equal to $1 \times 10^{19}$ cm$^3$, for example $2 \times 10^{19}$ cm$^3$. Although phosphorus (P) is employed as the n type impurity in the example of FIG. 10, nitrogen (N) or arsenic (As) may be employed.

Referring to FIGS. 1, 4A and 4B, contact region 135 is of p⁺ type conductivity, and formed in the p type body region, including first main face 137, so as to be surrounded by source region 134 in plan view. The ion implantation conditions to form contact region 135, and the impurity concentration distribution in the depth direction are shown in Table 3 and FIG. 11, respectively.

TABLE 3

|  | First | Second | Third |
|---|---|---|---|
| Ion Species | Al | Al | Al |
| Acceleration Voltage (keV) | 40 | 110 | 250 |
| Dosage (/cm$^2$) | $1.0 \times 10^{14}$ | $2.0 \times 10^{14}$ | $3.0 \times 10^{14}$ |

Figure 11:
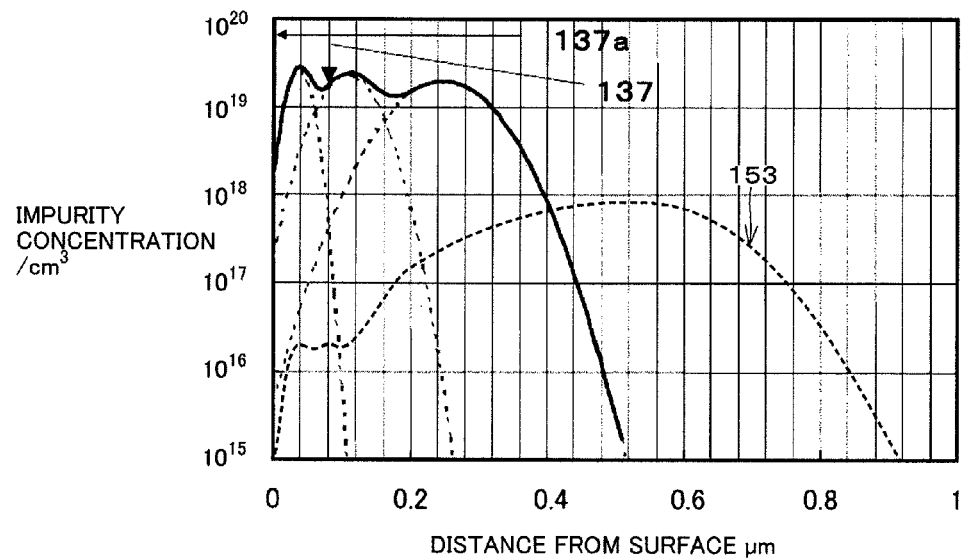
FIG. 11 represents results of impurity distribution in the depth direction calculated by Gaussian approximation in a contact region formation step of a silicon carbide insulating gate type semiconductor device

Table 3 represents first to third implantations based on the implantation parameters of the implantation species, acceleration voltage (keV) and dosage (atoms/cm$^2$) for the ion implantation conditions. In FIG. 11, the impurity concentration distribution in the depth direction of each implantation (broken line) and of the sum of each implantation (bold solid line) is shown, relative to a depth (μm) taken along the horizontal axis with first main face 137a of semiconductor layer 132 corresponding to the point in time of ion implantation as the origin. In the drawing, the impurity concentration of body region 133 is indicated by a dotted curve 153. First main face 137a of semiconductor layer 132 corresponding to the point in time of ion implantation will be lost by approximately 0.08 μm in an oxidation step that will be described afterwards. Therefore, first main face 137 of the produced silicon carbide insulating gate type semiconductor device 100 is shown in the drawing. Referring to FIG. 11, the depth from first main face 137 of contact region 135 is approximately 0.33 μm, from the crossing position between the bold solid line and dotted curve 153 in the drawing. In order to obtain favorable ohmic contact for contact region 135, the impurity concentration of the surface region including first main face 137 is greater than or equal to $1 \times 10^{19}$ cm$^{-3}$, for example $2 \times 10^{19}$ cm$^{-3}$. As the p type impurity, Al or B may be employed.

Figure 2A:
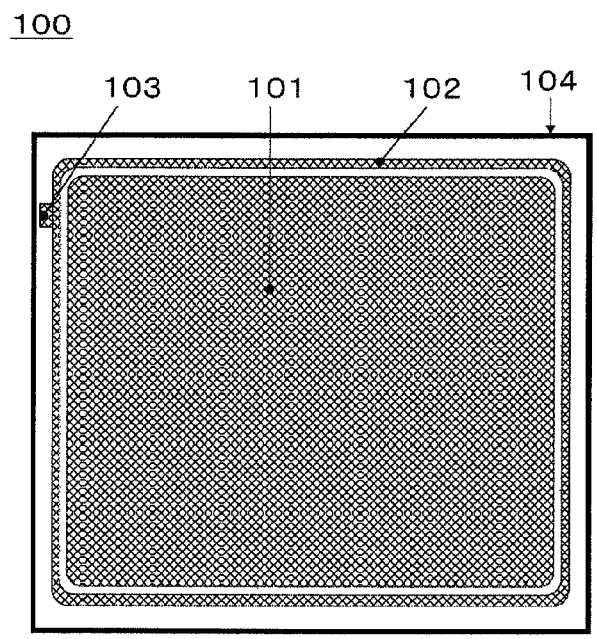
FIG. 2A is a schematic top view representing a schematic plan configuration of a silicon carbide insulating gate type semiconductor device.
Figure 2B:
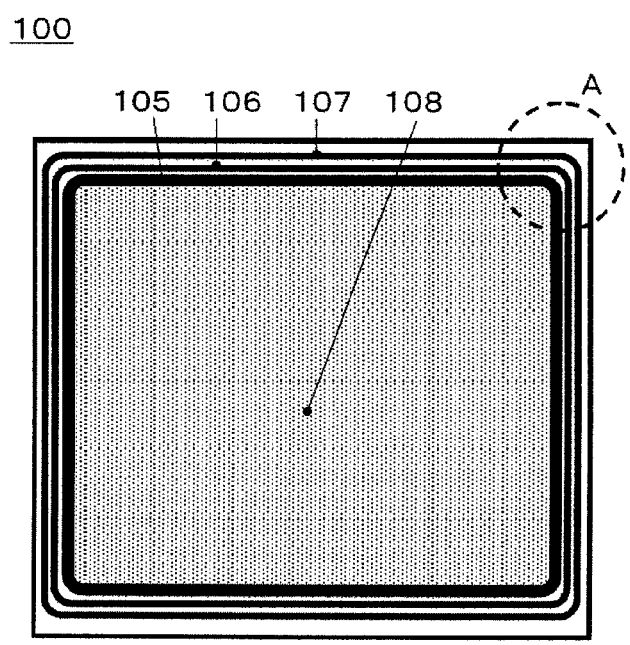
FIG. 2B represents a schematic plan configuration of a silicon carbide insulating gate type semiconductor device, showing an impurity region on a first main face.
Figure 3A:
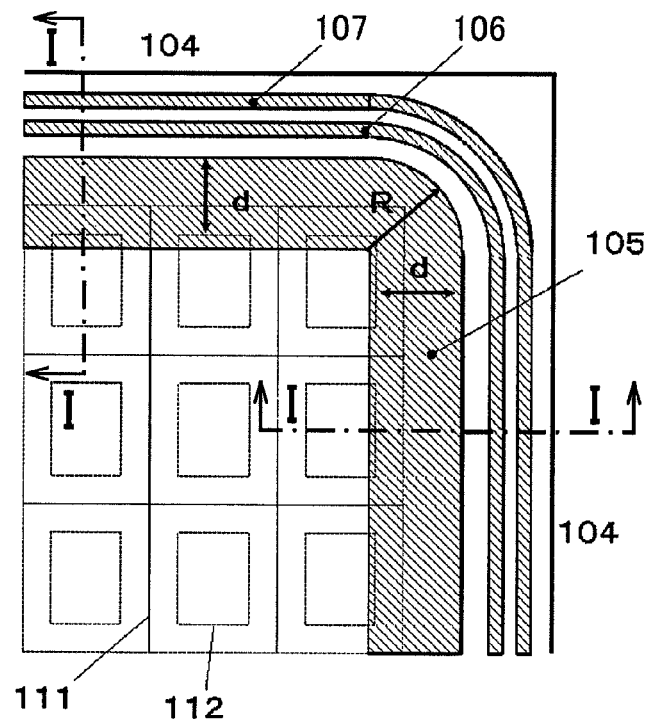
FIG. 3A is a plan view of the first main face corresponding to an enlargement of portion A in FIG. 2B of the silicon carbide insulating gate type semiconductor device, corresponding to the case where the basic cell takes a quadrangle shape.
Figure 3B:
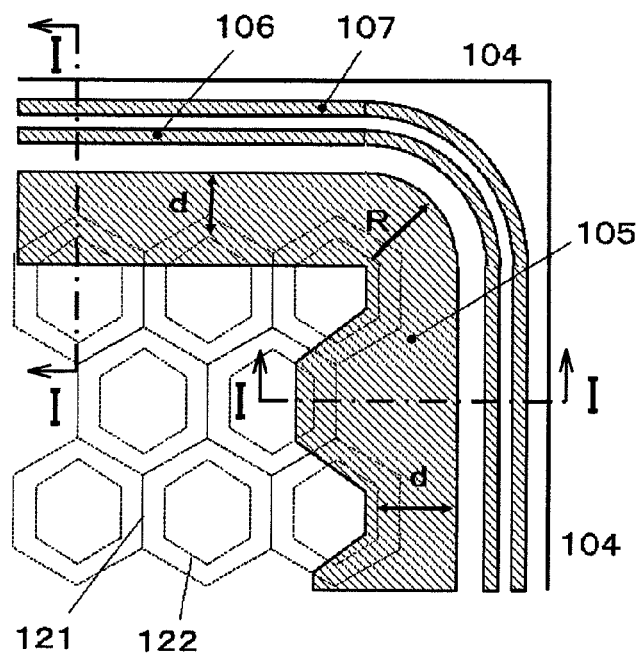
FIG. 3B is a plan view of the first main face corresponding to an enlargement of portion A in FIG. 2B of the silicon carbide insulating gate type semiconductor device, corresponding to the case where the basic cell takes a hexagon shape.

Circumferential resurf region 105 is formed in a strip so as to surround active region 108 and the circumference of active region 108, and so as to include first main face 137. This is shown in FIG. 2B representing a plan view of the entire appearance of insulating gate type semiconductor device 100 on first main face 137 of the semiconductor layer. FIGS. 3A and 3B are plan views of the enlargement of A portion in FIG. 2B; the former corresponding to a basic cell 110 taking a quadrangle shape and the latter corresponding to a basic cell 120 taking a hexagon shape. Referring to FIGS. 3A, 3B, 4A and 4B, a plurality of basic cells (110 or 120) surrounded by an imaginary boundary line constituting a polygon in plan view are arranged with no gap, in contact with the boundary line (111 or 121) in active region 108. Each of the plurality of basic cells (110 or 121) includes a p type body region 133, constituting an analogue to the aforementioned polygon at first main face 137. Circumferential resurf region 105 has a conductivity of the p type, formed to include body region 133 in the basic cell (110 or 120) constituting the outermost circumference of active region 108. The width d (refer to FIGS. 3A and 3B) of circumferential resurf region 105 excluding body region 133 is greater than or equal to ½ the thickness of at least semiconductor layer 132. For example, when the breakdown voltage of the device is 1 kV, semiconductor layer 132 has a thickness of approximately 10 μm, and the width d is greater than or equal to 5 μm. Circumferential resurf region 105 formed as set forth above serves to alleviate the electric field concentrated at a portion of body region 133 corresponding to the outermost circumference, allowing the breakdown voltage of silicon carbide insulating gate type semiconductor device 100 to be improved.

Figure 12:
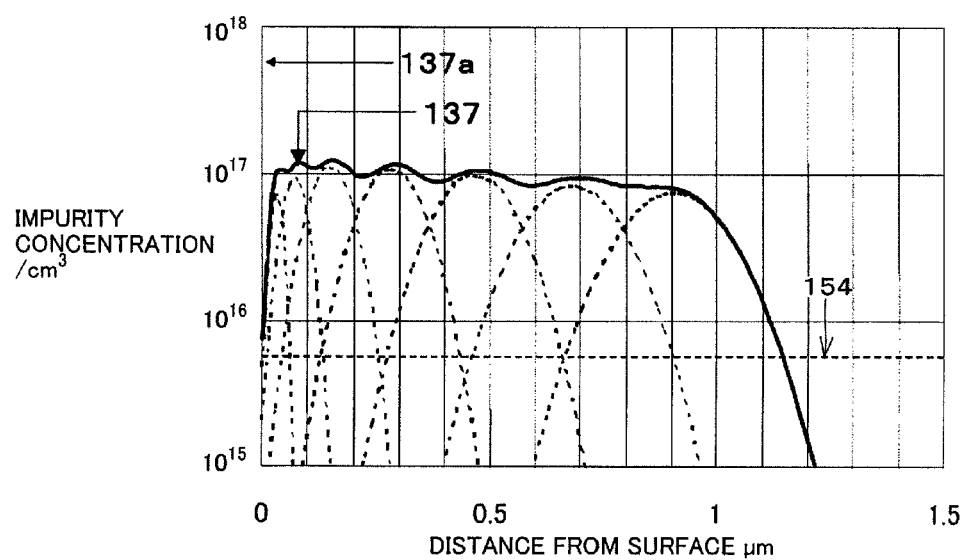
FIG. 12 represents results of impurity distribution in the depth direction calculated by Gaussian approximation in a circumferential resurf region formation step of a silicon carbide insulating gate type semiconductor device.

Table 4 and FIG. 12 represent the ion implantation condition for formation of circumferential resurf region 105 and the distribution of the impurity concentration in the depth direction, respectively.

TABLE 4

|  | First | Second | Third | Fourth | Fifth | Sixth | Seventh |
|---|---|---|---|---|---|---|---|
| Ion Species | Al | Al | Al | B | B | B | B |
| Acceleration Voltage (keV) | 35 | 75 | 150 | 110 | 200 | 320 | 460 |
| Dosage (/cm$^2$) | $2.5 \times 10^{11}$ | $6.0 \times 10^{11}$ | $1.2 \times 10^{12}$ | $1.7 \times 10^{12}$ | $2.0 \times 10^{12}$ | $2.0 \times 10^{12}$ | $2.0 \times 10^{12}$ |

Table 4 represents first to seventh implantations based on the implantation parameters of implantation species, acceleration voltage (keV) and dosage (atoms/cm$^2$) for the ion implantation conditions. In FIG. 12, the impurity concentration distribution in the depth direction of each implantation (broken line) and of the sum of each implantation (bold solid line) is shown, relative to a depth (μm) taken along the horizontal axis with first main face 137a of semiconductor layer 132 corresponding to the point in time of ion implantation as the origin. In the drawing, the impurity concentration of semiconductor layer 132 is indicated by a dotted straight line 154. First main face 137a of semiconductor layer 132 corresponding to the point in time of ion implantation will be lost by approximately 0.08 μm in an oxidation step that will be described afterwards. Therefore, first main face 137 of the produced silicon carbide insulating gate type semiconductor device 100 is shown in the drawing. Referring to FIG. 12, the impurity concentration of p type circumferential resurf region 105 is generally about $1 \times 10^{17}$ cm$^{-3}$. From the crossing position between the bold solid line and dotted straight line 154 in the drawing, the depth of circumferential resurf region 105 from first main face 137 is approximately 1.1 μm. Although the distribution of impurity concentration in the depth direction of circumferential resurf region 105 is substantially constant in the present embodiment, the distribution of impurity concentration in the depth direction of circumferential resurf region 105 satisfies the relationship set forth below with the distribution of the impurity concentration of body region 133 in the depth direction.

First, at the surface region of semiconductor layer 132 up to the depth of 0.05 μm into semiconductor layer 132 from first main face 137 of semiconductor layer 132, the average impurity concentration of body region 133 is in the vicinity of $1 \times 10^{16}$ cm$^{-3}$, particularly about $2 \times 10^{16}$ cm$^{-3}$ since it is closely related to the electric property such as the threshold voltage and channel mobility of silicon carbide insulating gate type semiconductor device 100. If the average impurity concentration of circumferential resurf region 105 is lower than the average impurity concentration of body region 133 at the surface region, the surface region of body region 133 is depleted when insulating gate type semiconductor device 100 is OFF, rendering the transition of insulating gate type semiconductor device 100 to an ON state unstable. By setting the average impurity concentration of circumferential resurf region 105 higher than that of body region 133 at the surface region, introduction of a depletion layer into the surface region of body region 133 is prevented, allowing stable transition to an ON state. At the surface region, the average impurity concentration of p type circumferential resurf region 105 is preferably higher than the average impurity concentration of p type body region 133, more preferably at least three times the average impurity concentration of p type body region 133. In the examples of FIGS. 9 and 12, the average impurity concentration of circumferential resurf region 105 is approximately $1 \times 10^{17}$ cm$^{-3}$, which is about 5 times the average impurity concentration of body region 133 that is approximately $2 \times 10^{16}$ cm$^{-3}$.

Secondly, body region 133 has a p type impurity concentration distribution so as to exhibit a maximal value, approximately $1 \times 10^{18}$ cm$^{-3}$ in the example of FIG. 12, in the depth direction from first main face 137. At the depth of body region 133 corresponding to the maximal value, the p type impurity concentration of circumferential resurf region 105 is preferably less than or equal to ⅓ the maximal value of the p type impurity concentration of body region 133. With first main face 137 as the reference in the examples of FIGS. 9 and 12, at the depth of approximately 0.4 μm corresponding to the maximal value of p type body region 133, the impurity concentration of circumferential resurf region 105 is approximately $1 \times 10^{17}$ cm$^{-3}$, which is approximately ⅒ the impurity concentration of body region 133 that is approximately $1 \times 10^{18}$ cm$^{-3}$. The depth of circumferential resurf region 105 is preferably greater than the depth of body region 133. Accordingly, concentration of an electric field at a portion of body region 133 will no longer occur. Circumferential resurf region 105 functions sufficiently as an electric field alleviation layer, allowing the breakdown voltage of silicon carbide insulating gate type semiconductor device 100 to be improved. With first main face 137 as the reference in the examples of FIGS. 9 and 12, circumferential resurf region 105 has a depth of 1.1 μm, deeper than the depth of body region 133 that is 0.8 μm.

Although circumferential resurf region 105 is formed deeper than body region 133 in semiconductor layer 132, the deep portion of circumferential resurf region 105 can be readily realized by using B for the p type impurity species. In the examples of Table 4 and FIG. 12, Al is employed as the implantation species in the first to third implantations, whereas B is taken as the implantation species for the fourth to seventh implantations. This is because the ion implantation range of B is greater than that of Al.

Referring to FIGS. 3A and 3B, the outer circumference of strip-like circumferential resurf region 105 in plan view takes a chamfered quadrangle shape having the four corners rounded. The radius R of the chamfered section is preferably greater than or equal to the thickness of semiconductor layer 132. For example, when the breakdown voltage of silicon carbide insulating gate type semiconductor device 100 is 1 kV, semiconductor layer 132 will have a thickness of approximately 10 μm and a radius R greater than or equal to 10 p.m. By virtue of the four corners at the outer circumference of circumferential resurf region 105 being rounded, electric field concentration is alleviated, allowing the breakdown voltage of silicon carbide insulating gate type semiconductor device 100 to be further improved.

Referring to 2B, guard rings 106 and 107 have a p type conductivity identical to that of circumferential resurf region 105, formed so as to surround circumferential resurf region 105. In the present embodiment, the guard rings are formed simultaneously to the circumferential resurf region, and have an impurity concentration distribution similarly in the depth direction. Preferably, at least one guard ring is provided. FIG. 2B corresponds to the case where a first guard ring 106 and a second guard ring 107 are provided. Since guard rings 106 and 107 serve to alleviate the electric field, the breakdown voltage of silicon carbide insulating gate type semiconductor device 100 can be further improved.

Figure 6:
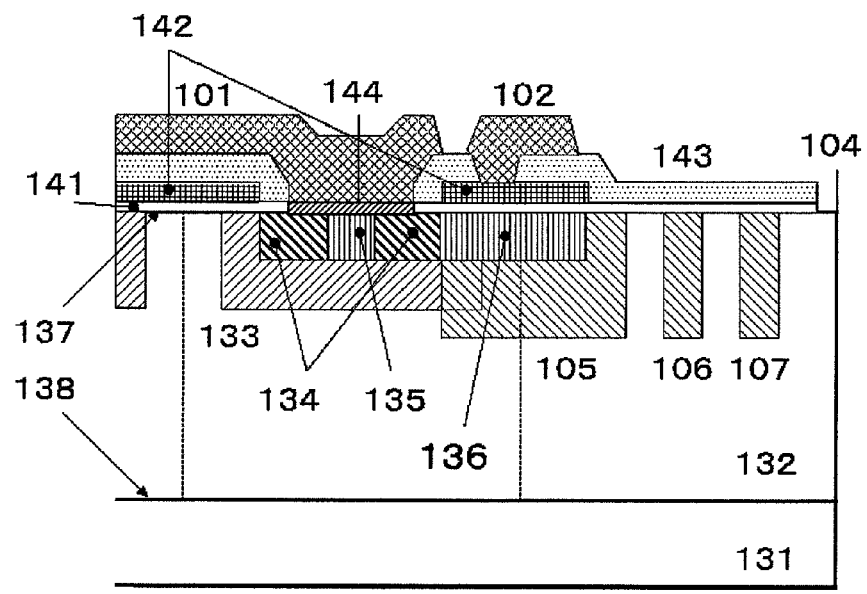
FIG. 6 represents a cross-sectional configuration of a termination section in a silicon carbide insulating gate type semiconductor device with an anti-inversion layer introduced.

Insulating gate type semiconductor device 100 of the present embodiment may further include an anti-inversion region 136. FIG. 6 represents a cross-sectional configuration of a termination section in insulating gate type semiconductor device 100 having anti-inversion region 136 added. Referring to FIG. 6, anti-inversion region 136 is formed to have an impurity concentration higher than that of body region 133, including first main face 137, substantially right below gate electrode 142 located at the overlapping region in plan view between basic cells (110 or 120) located at the outermost circumference and the circumferential resurf region. Anti-inversion region 136 has a p type conductivity, formed simultaneous to p type contact region 135 in the example of FIG. 6. The impurity concentration in anti-inversion region 136 is identical to the impurity concentration in p type contact region 135. By providing anti-inversion region 136, formation of an inversion layer at the surface region of semiconductor layer 132 substantially right below gate electrode 142 is less likely to occur, allowing the breakdown voltage of silicon carbide insulating gate type semiconductor device 100 to be improved.

Referring to FIG. 1, gate oxide film 141 is formed on semiconductor layer 132. Gate oxide film 141 is made of oxide formed by oxidation of SiC, i.e. silicon dioxide ($SiO_2$), for example. The thickness of gate oxide film 141 is approximately 40 nm, for example. Gate electrode 142 is formed on gate oxide film 141 with a desired plan arrangement, made of polycrystalline Si into which P is doped in high concentration, and has a thickness of approximately 0.5 μm. The sheet resistance (the resistance value is determined by the vertical and horizontal dimension ratio) of gate electrode 142 is approximately 10 to 100 m)/□. Interlayer insulating film 143 is formed on gate oxide film 141 and gate electrode 142, made of an oxide of $SiO_2$, and has a thickness of approximately 0.6 μm. Interlayer insulating film 143 may also be made of $SiO_2$ containing approximately several % of P or B, or may be made of silicon nitride (SiN). Ohmic electrode 144 is electrically connected to source region 134 and contact region 135, and formed on first main face 137 of semiconductor layer 132 so as to include contact region 135 and source region 134 of each basic cell (110 or 120). Ohmic electrode 144 is made of alloy containing titanium (Ti), Al and Si, and has a thickness of approximately 0.1 μm to 0.2 μm. Ohmic electrode 144 realizes a contact resistance less than or equal to $1 \times 10$ cm$^{-3}$ Ωcm$^{-2}$ with respect to contact region 135 that is of p$^+$ type and source region 134 that is of n$^+$ type. Source interconnection 101 is electrically connected to all ohmic electrodes 144 in the plurality of basic cells (110 or 120) constituting active region 108 (refer to FIG. 2B), and is formed on ohmic electrode 144 and interlayer insulating film 143, and all over the inner side of active region 108 in plan view. Source interconnection 101 is made of metal such as Al, Al alloy (including Si, Ti, copper (Cu), and the like), or Cu, and has a thickness of approximately 2 to 5 μm, depending upon the current capacity of silicon carbide insulating gate type semiconductor device 100.

Gate liner interconnection 102 is arranged in a strip on circumferential resurf region 105 with interlayer insulating film 143 thereunder, and is made of metal such as Al or Al alloy. Gate liner interconnection 102 is preferably connected electrically to all gate electrodes 142 of basic cells (110 or 120) located at the outermost circumference. The electrical connection between gate liner interconnection 102 and all gate electrodes 142 located at the outermost side allows the gate resistance of silicon carbide insulating gate type semiconductor device 100 to be reduced. Therefore, operation at high frequency is allowed.

Referring to FIGS. 3A, 3B, 4A and 4B, a basic cell (110 or 120) take a polygon shape surrounded by an imaginary boundary line (111, 121) in plan view. A plurality of basic cells are arranged with no gap in active region 108 so as to contact each other at the boundary line. The basic cell preferably has a hexagon shape (120) in plan view. Accordingly, the body region formed in the basic cell is substantially analogous to a hexagon shape. Since each vertex angle of the body region corresponds to an obtuse angle, concentration of an electric field is reduced, allowing the breakdown voltage of silicon carbide insulating gate type semiconductor device 100 to be improved.

The configuration of gate electrode 142 in plan view will be described hereinafter with reference to FIGS. 3A, 3B, 4A and 4B. In each basic cell (110 or 120), gate electrode 142 is formed within the imaginary boundary line (111 or 121) of each basic cell, and above the region excluding the source region (114 or 124), with gate oxide film 141 thereunder. Therefore, gate electrodes 142 are formed corresponding to a polygon mesh on active region 108. The formation of gate electrode 142 in a mesh-like manner allows, even when one gate electrode 142 is disconnected, overall electrical conduction of gate electrodes 142 in silicon carbide insulating gate type semiconductor device 100.

Figure 5:
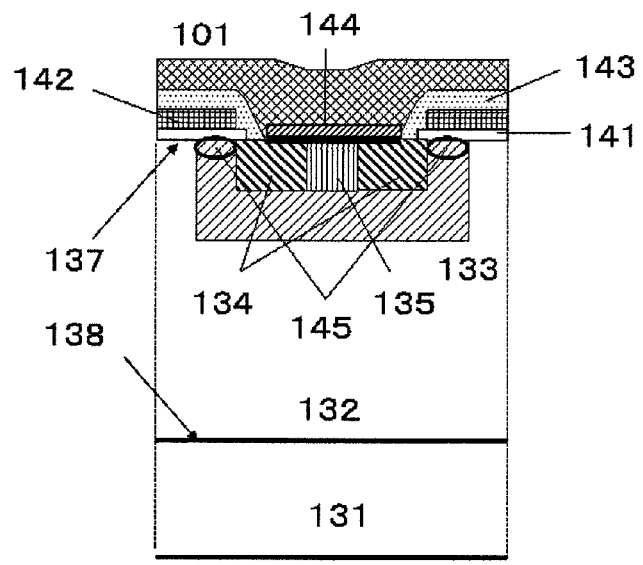
FIG. 5 represents a cross-sectional configuration of a basic cell in a silicon carbide insulating gate type semiconductor device.

The operation of silicon carbide insulating gate type semiconductor device 100 of the present embodiment will be described hereinafter with reference to FIG. 5.

First, an ON state of silicon carbide insulating gate type semiconductor device 100 will be described. FIG. 5 represents a cross-sectional configuration taken along line V-V shown in FIGS. 4A and 4B. Referring to FIG. 5, when a voltage higher than the threshold voltage with respect to source interconnection 101 is applied to gate electrode 142, an inversion layer (a layer of n conductivity type) is formed at channel region 145 including first main face 137, in semiconductor layer 132 at p type body region 133 located substantially right below gate electrode 142. By this formation of an inversion layer, electrical connection with $n^+$ type substrate 131 is established via $n^+$ type source region 134 and $n^-$ type semiconductor layer 132. Although not shown in FIG. 5, a drain electrode is formed on the main face of substrate 131 opposite to the main face in contact with semiconductor layer 132. As a result of formation of an inversion layer, current flows across source interconnection 101 and the drain electrode.

In silicon carbide insulating gate type semiconductor device 100 of the present embodiment, first main face 137 of semiconductor layer 132 preferably has a plane orientation whose off angle relative to plane orientation {0001} is greater than or equal to 50° and less than or equal to 65°, for example, plane orientation {03-38}. Accordingly, the formation of an interface state in the proximity of the interface between gate oxide film 141 and semiconductor layer 132 at channel region 145 is suppressed, so that the mobility of electrons in the inversion layer is improved. Therefore, a silicon carbide insulating gate type semiconductor device 100 of low loss is allowed.

When a voltage less than or equal to the threshold voltage with respect to source interconnection 101 is applied to gate electrode 142, or when the potential of gate electrode 142 is set equal to the potential of source interconnection 101, silicon carbide insulating gate type semiconductor device 100 attains an OFF state, so that current does not flow across source interconnection 101 and the drain electrode. This is because the inversion layer formed at the channel region 145 is eliminated, so that source region 134 will not be electrically connected to $n^-$ type semiconductor layer 132 through p type body region 133.

In such an OFF state, a depletion layer extends towards each of p type body region 133 and $n^-$ type semiconductor layer 132 from the pn junction by p type body region 133 and $n^-$ type semiconductor layer 132. At this stage, the total amount of p type impurities in the depletion layer at p type body region 133 is generally equal to the total amount of $n^-$ type impurities in the depletion layer at $n^-$ type semiconductor layer 132. Since it is difficult to form a deep impurity region by silicon carbide, p type body region 133 must exhibit an impurity concentration distribution in the depth direction with a maximum in semiconductor layer 132.

Particularly at the termination section of silicon carbide insulating gate type semiconductor device 100 in an OFF state (refer to FIG. 1), it is critical to provide an electric field alleviation layer such as by circumferential resurf region 105 and/or guard rings 106 and 107 since electric field concentration readily occurs at a portion of body region 133. In addition, the provision of anti-inversion region 136 (refer to FIG. 6) is effective for a stable operation of silicon carbide insulating gate type semiconductor device 100. Moreover, by avoiding concentration of electric field by virtue of the plurality of basic cells arranged in the active region taking a hexagon shape in plan view whose vertex angle is an obtuse angle, the breakdown voltage of silicon carbide insulating gate type semiconductor device 100 can be increased.

Moreover, it is critical to reduce the gate resistance when seen from a gate terminal external to the device for silicon carbide insulating gate type semiconductor device 100 to allow high-speed switching or to operate at high frequency. By electrically connecting the gate electrode included in each of a plurality of basic cells located at the outermost circumference with gate liner interconnection 102 in insulating gate type semiconductor device 100 of the present embodiment, the gate resistance is reduced, allowing high speed operation and high frequency operation.

Figure 7:
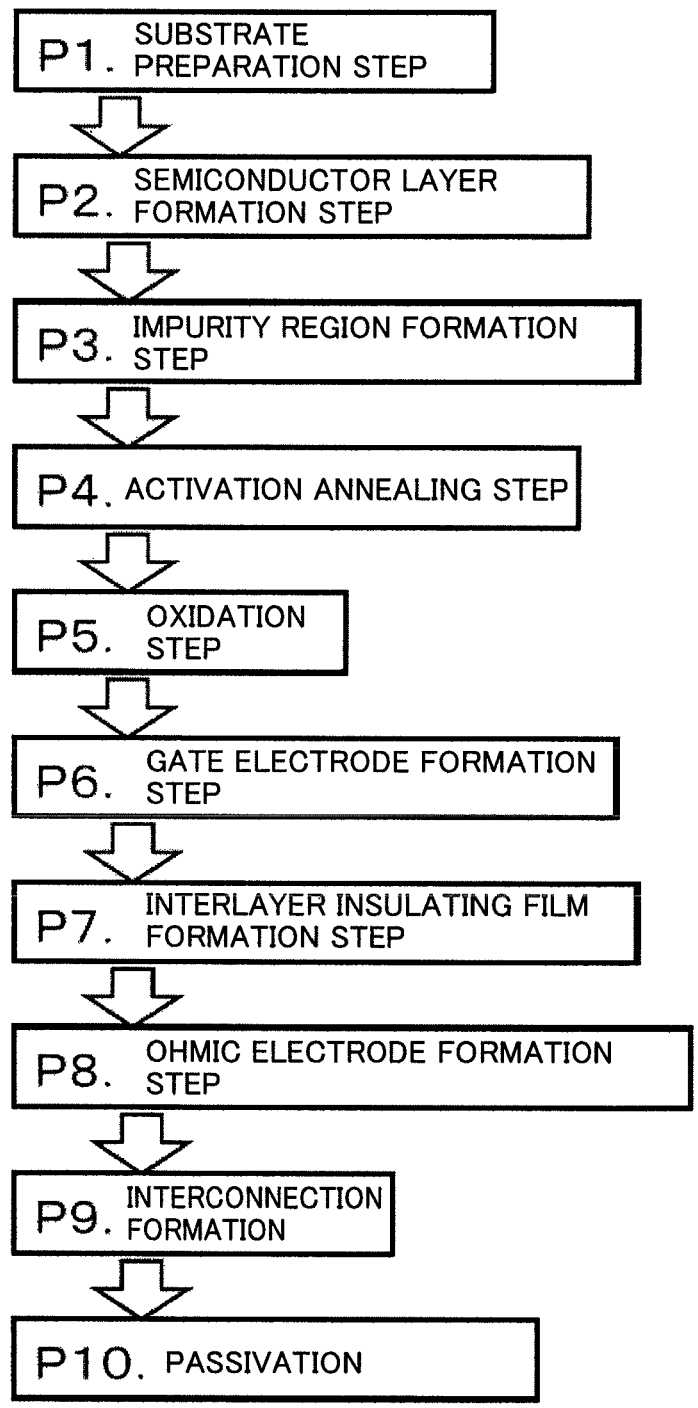
FIG. 7 is a flowchart of fabrication steps of a silicon carbide insulating gate type semiconductor device.

A method of fabricating an insulating gate type semiconductor device 100 of the present embodiment will be described based on the fabrication flow of FIG. 7 as well as FIGS. 8A-8L at a point in time when each step is completed. Referring to FIG. 7, insulating gate type semiconductor device 100 is fabricated in the sequence of a substrate preparation step P1, a semiconductor layer formation step P2, an impurity region formation step P3, an activation annealing step P4, an oxidation step P5, a gate electrode formation step P6, an interlayer insulating film formation step P7, an ohmic electrode formation step P8, an interconnection formation step P9, and a passivation step P10. FIGS. 8A-8L represent a plan configuration and a cross-sectional configuration of an insulating gate type semiconductor device in the fabrication process. The fabrication method will be described in detail hereinafter with reference to FIGS. 8A-8L.

At step P1 (FIG. 7), substrate 131 is prepared. For example, a substrate 131 made of single crystal silicon carbide having a polytype of 4H, and of n type conductivity is prepared at step P1. The plane orientation of the main face of substrate 131 is, for example, {0001}. More preferably, the main face of substrate 131 has an off angle greater than or equal to 50° and less than or equal to 65° relative to plane orientation {0001}, more preferably, has plane orientation {03-38}. Further, substrate 131 preferably has a low resistivity. Therefore, a substrate having an n type impurity concentration of $5 \times 10^{18}$ $cm^{-3}$ to $6 \times 10^{19}$ $cm^{-3}$, for example, is prepared.

At step P2 (FIG. 7), semiconductor layer 132 is formed on substrate 131. Specifically, referring to the plan configuration of FIG. 8A and the cross-sectional configuration of FIG. 8B, n⁻ type semiconductor layer 132 made of silicon carbide is formed by epitaxial growth on the main face of substrate 131. Epitaxial growth is carried out based on the mixture of $SiH_4$ (silane) and $C_3H_8$ (propane) as the material gas, further having n type impurities introduced. At this stage, the impurity concentration and thickness of semiconductor layer 132 may be adjusted depending upon the breakdown voltage of the device. For example, when the breakdown voltage of the semiconductor device is 1 kV, the n type impurity concentration of semiconductor layer 132 is approximately $5 \times 10^{15}$ $cm^3$, and the thickness is approximately 10 μm. For the n type impurity, nitrogen, for example, is employed.

Semiconductor layer 132 includes second main face 138 in contact with substrate 131, and first main face 137a at the opposite side. Since substrate 131 is made of silicon carbide identical to that of semiconductor layer 132, the plane orientation of first main face 137a can be set identical to the plane orientation of the main face of the substrate in contact with second main face 138 by means of homogenous growth. By the main face of the substrate in contact with semiconductor layer 132 having a plane orientation whose off angle relative to {0001} is greater than or equal to 50° and less than or equal to 65°, particularly a plane orientation of {03-38}, first main face 137a of semiconductor layer 132 can be set to have the above-described plane orientation. Such a plane orientation for first main face 137a allows increasing the mobility of electrons in the inversion layer formed at channel region 145 when silicon carbide insulating gate type semiconductor device 100 is ON. Therefore, low loss of silicon carbide insulating gate type semiconductor device 100 can be realized.

At step P3 (FIG. 7), an impurity region is formed so as to include first main face 137a in semiconductor layer 132. Referring to the plan configuration of FIG. 8C and the cross-sectional configuration of FIG. 8D, body region 133, source region 134, and contact region 135 are formed by ion implantation in step P3. Referring to the plan configuration of FIG. 8E and the cross sectional configuration of FIG. 8F, circumferential resurf region 105 and guard rings 106 and 107 are formed by ion implantation. Then, activation annealing of the introduced impurities is effected by thermal treatment. In the case of silicon carbide, impurities hardly diffuse. It is difficult to introduce impurities from a gaseous or solid source. Therefore, impurities are introduced by ion implantation. An impurity distribution in the depth direction is realized by ion implantation carried out over multiple times.

Figure 13A:
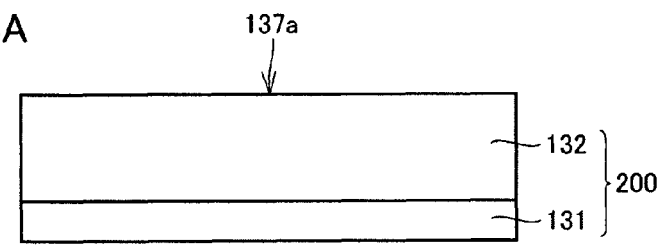
FIG. 13A is a sectional view schematically representing a first step in a method of forming an impurity region by ion implantation.
Figure 13B:
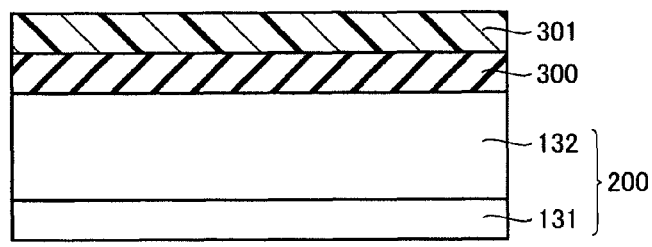
FIG. 13B is a sectional view schematically representing a second step in the method of forming an impurity region by ion implantation.
Figure 13C:
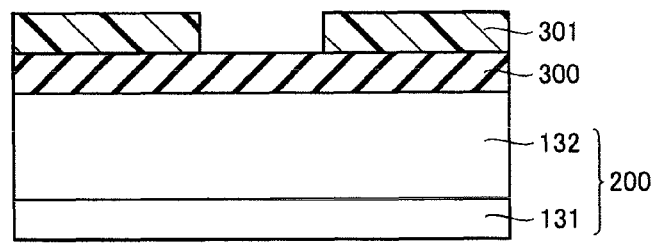
FIG. 13C is a sectional view schematically representing a third step in the method of forming an impurity region by ion implantation.
Figure 13D:
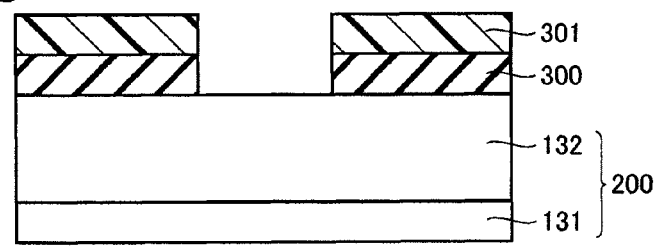
FIG. 13D is a schematic sectional view representing a fourth step in the method of forming an impurity region by ion implantation.
Figure 13E:
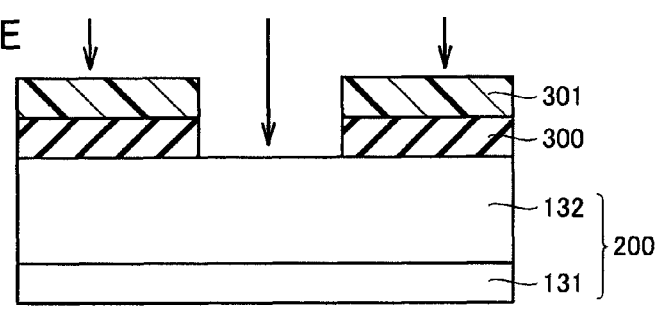
FIG. 13E is a schematic sectional view representing a fifth step in the method of forming an impurity region by ion implantation.

A method of forming an impurity region by ion implantation will be described specifically hereinafter. First, by step P2 as described above, an epitaxial substrate 200 including substrate 131 and semiconductor layer 132 with first main face 137a is prepared (FIG. 13A). Then, on epitaxial substrate 200, i.e. on first main face 137a of semiconductor layer 132, an oxide film 300 (mask member for ion implantation) made of silicon dioxide ($SiO_2$) is formed by CVD (Chemical Vapor Deposition), for example (FIG. 13B). A resist is applied on oxide film 300, followed by exposure and developing, to form a resist film 301 having an opening corresponding to the shape of each desired impurity region (FIG. 13C). Using resist film 301 as a mask, oxide film 300 exposed at the opening of resist film 301 is removed by RIE (Reactive Ion Etching), for example. Ions are implanted with oxide film 300 and resist film 301 as the mask, whereby impurities are introduced into semiconductor layer 132 at the opening (FIG. 13E). Following ion implantation, resist film 301 and oxide film 303 are removed by oxygen plasma ashing and hydrochloric acid based solution, respectively.

Body region 133 of p type conductivity is formed such that the impurity concentration varies in the depth direction from first main face 137a of semiconductor layer 132. Referring to the example in FIG. 9, p type impurities are introduced over a depth of approximately 0.9 μm. The concentration thereof is approximately $2 \times 10^{16}$ $cm^{-3}$ in the vicinity of the surface up to the depth of 0.15 μm, referenced to first main face 137a, and has a maximal value of $2 \times 10^{17}$ $cm^{-3}$ at the depth greater than or equal to 0.15 μm. For p type impurities, B and Al can be cited. Here, Al having a shallow acceptor level is employed. This is because a silicon carbide insulating gate type semiconductor device 100 of low loss can be realized since the carriers have high activation rate when the acceptor level is shallow. Further, since semiconductor layer 132 will be partially lost by oxidation step P5 (FIG. 7) that will be described afterwards, first main face 137 of semiconductor layer 132 in the produced semiconductor device 100 is located at the depth of approximately 0.08 μm at this stage.

Source region 134 of n type conductivity is formed by ion implantation over multiple times with P as the n type impurity. For the n type impurity, N or arsenic (As) may also be employed. Referring to the example of FIG. 10, a source region 134 of approximately 0.53 μm in depth, having an impurity concentration distribution in the depth direction is formed, wherein the n type impurity concentration is approximately $2 \times 10^{19}$ $cm^{-3}$ in the vicinity of a depth 0.08 μm, referenced to first main face 137a.

Contact region 135 of p type conductivity is formed by ion implantation over multiple times with Al as the p type impurity. For the p type impurity, B may also be employed. Referring to the example of FIG. 11, a contact region 135 of approximately 0.4 μm in depth, having an impurity concentration distribution in the depth direction is formed, wherein the p type impurity concentration is approximately $2 \times 10^{19}$ $cm^{-3}$ in the vicinity of a depth 0.08 μm, referenced to first main face 137a.

Since semiconductor layer 132 will be partially lost by oxidation step P5 (FIG. 7) that will be described afterwards, first main face 137 of semiconductor layer 132 having an ohmic electrode that will be described afterwards formed is located at the depth of approximately 0.08 μm at this stage. By setting the impurity concentration at the depth of approximately 0.08 μm in the vicinity of approximately $2 \times 10^{19}$ $cm^{-3}$, a favorable ohmic contact can be realized.

Circumferential resurf region 105 of p type conductivity is formed by varying the impurity concentration in the depth direction from first main face 137a of semiconductor layer 132. Referring to the example of FIG. 12, circumferential resurf region 105 of approximately 1.2 μm in depth, having an impurity concentration distribution in the depth direction is formed, wherein the p type impurity concentration is approximately $1 \times 10^{17}$ $cm^{-3}$ in the proximity of the surface down to the depth of approximately 0.15 μm, referenced to first main face 137a, and exhibiting a maximal value of $2 \times 10^{17}$ $cm^{-3}$ at the depth greater than or equal to 0.15 μm. For the p type impurity, B and Al are employed. The shallow portion is made of Al, and the deep region is made of B. Since semiconductor layer 132 is partially lost by oxidation step P5 (FIG. 7) that will be described afterwards, first main face 137 of semiconductor layer 132 will be located at the depth of approximately 0.08 μm at this stage.

Formation of guard rings 106 and 107 may be carried out simultaneously to the formation of circumferential resurf region 105 or the formation of contact region 135. In the present embodiment, the formation of guard rings 106 and 107 is carried out simultaneous to the formation of circumferential resurf region 105. Moreover, formation of anti-inversion region 136 is carried out simultaneous to the formation of contact region 135 in the present embodiment.

In order to render the impurity regions formed by ion implantation such as body region 133, source region 134, contact region 135, circumferential resurf region 105, and guard rings 106, 107 electrically active, activation annealing step P4 (FIG. 7) is carried out at one time. At step P4, a thermal treatment maintained at 1700° C. for 30 minutes in an argon gas atmosphere, for example, can be carried out.

Then, the main face of the semiconductor layer is subjected to thermal oxidation. At step P5 (FIG. 7), in order to remove the damage (defect) caused by ion implantation or the like, present at the surface of first main face 137a of semiconductor layer 132, thermal oxidation (sacrificial oxidation) is performed once, followed by removing the oxide film produced by the sacrificial oxidation. Then, thermal oxidation is performed again to form gate oxide film 141. Sacrificial oxidation and gate oxidation are both performed by exposing the substrate in the fabrication process in a dry oxygen atmosphere for 60 minutes at the temperature of 1300° C., for example. At this stage, the thickness of the oxide film produced by one thermal oxidation is approximately 40 nm. In accordance with the growth (formation) of an oxide film, semiconductor layer 132 will be consumed by a thickness substantially equal to the thickness of the oxide film when silicon carbide is used. Therefore, first main face 137 of the semiconductor layer recedes approximately 80 nm (0.08 µm) inward of the semiconductor layer, referenced to first main face 137a prior to the oxidation step.

Figure 8A:
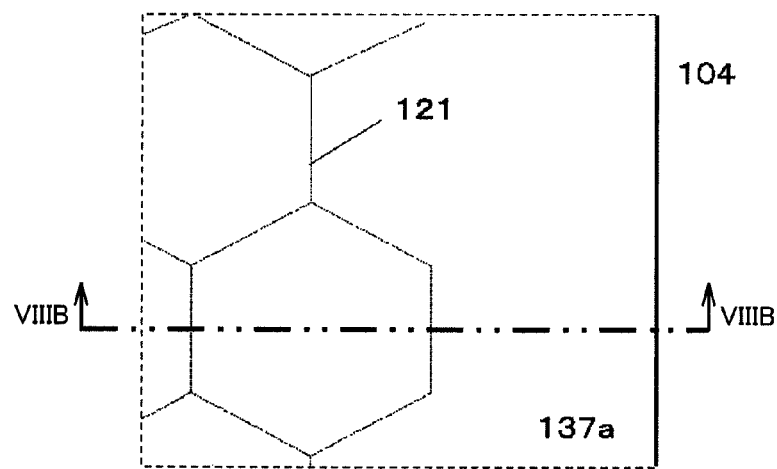
FIG. 8A is a top view at a point in time when an epitaxial growing step is completed according to a method of fabricating a silicon carbide insulating gate type semiconductor device.
Figure 8B:
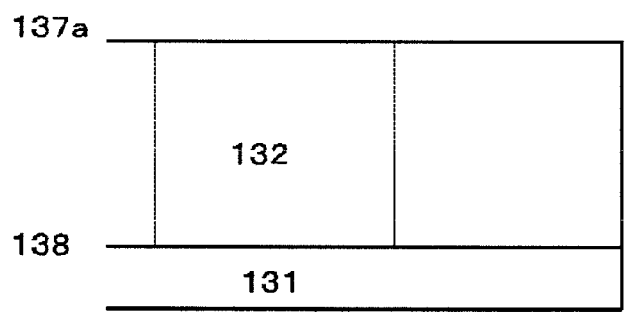
FIG. 8B is a schematic sectional view taken along line VIIIB-VIIIB of FIG. 8A.
Figure 8C:
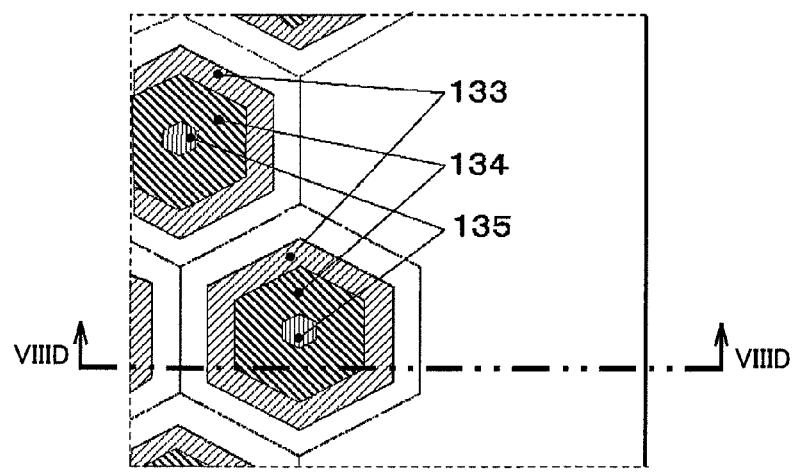
FIG. 8C is a top view at a point in time when a body region, a source region, and a contact region forming step is completed according to a method of fabricating a silicon carbide insulating gate type semiconductor device.
Figure 8D:
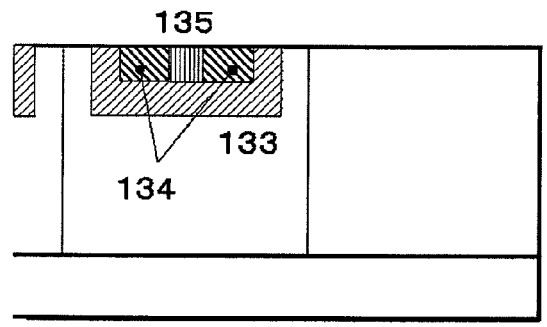
FIG. 8D is a schematic sectional view taken along line VIIID-VIIID of FIG. 8C.
Figure 8E:
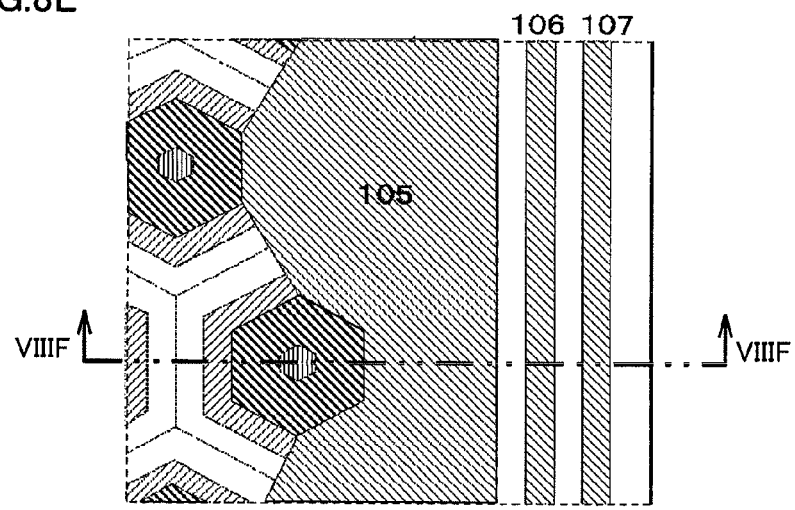
FIG. 8E is a top view at a point in time when a circumferential resurf region and guard ring formation step is completed according to a method of fabricating a silicon carbide insulating gate type semiconductor device.
Figure 8F:
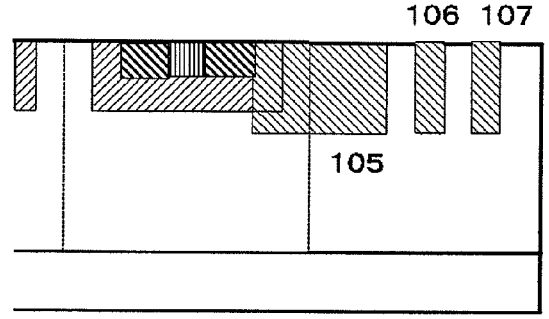
FIG. 8F is a schematic sectional view taken along line VIIIF-VIIIF of FIG. 8E.
Figure 8G:
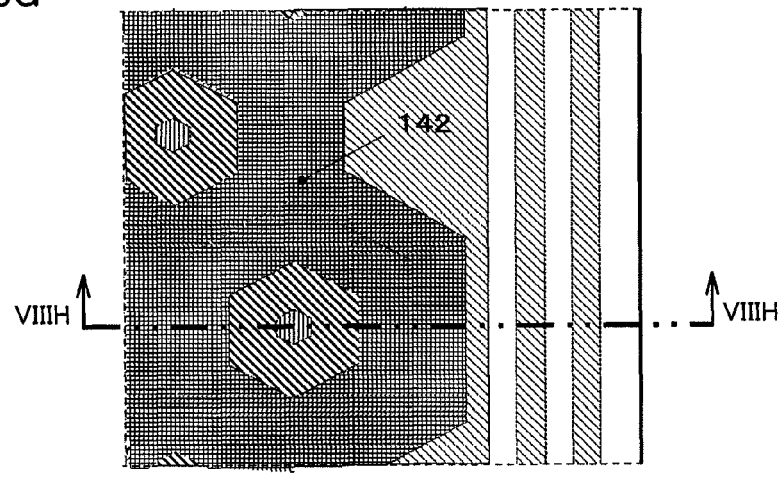
FIG. 8G is a top view at a point in time when an oxidation step and a gate electrode formation step are completed according to a method of fabricating a silicon carbide insulating gate type semiconductor device.
Figure 8H:
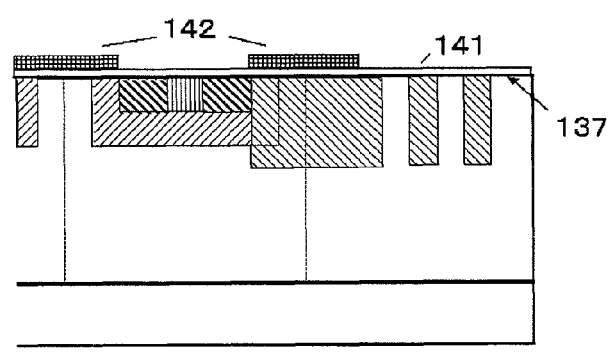
FIG. 8H is a schematic sectional view taken along line VIIIH-VIIIH of FIG. 8G.
Figure 8I:
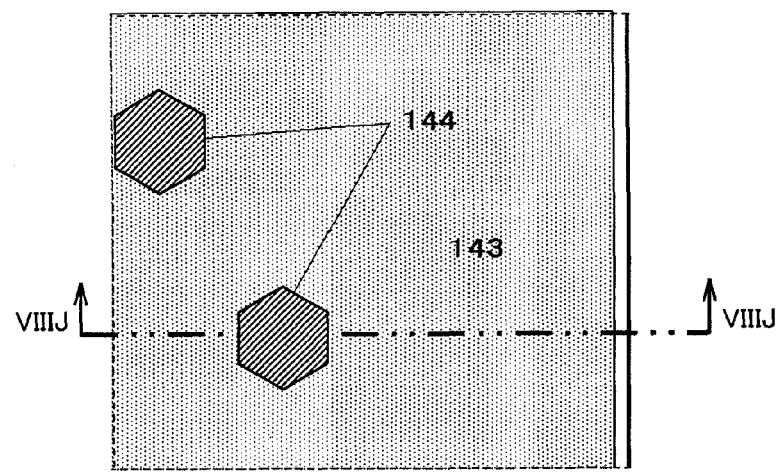
FIG. 8I is a top view at a point in time when an ohmic electrode formation step is completed according to a method of fabricating a silicon carbide insulating gate type semiconductor device.
Figure 8J:
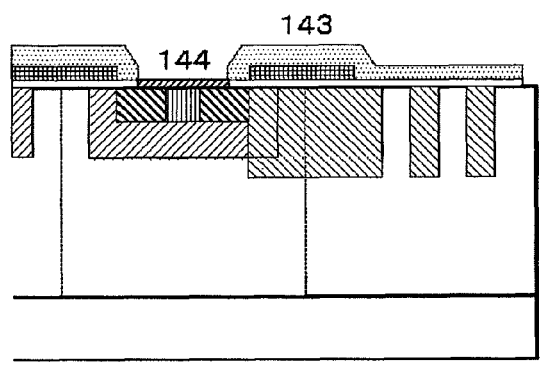
FIG. 8J is a schematic sectional view taken along line VIIIJ-VIIIJ of FIG. 8I.

Referring to the plan configuration of FIG. 8G and the cross-sectional configuration of FIG. 8H, gate electrode 142 is formed on gate oxide film 141. At this step P6 (FIG. 7), a polycrystalline silicon film is formed by LPCVD (Low Pressure Chemical Vapor Deposition). This polycrystalline silicon film is etched to a predetermined configuration by photolithography to form a gate electrode. In the LPCVD method, $PH_3$ (phosphine) is introduced as the n type impurity, using $SiH_2Cl_2$ (dichlorosilane) as the material gas, to form a polycrystalline silicon film having impurities doped at the temperature of 1000° C. and reduced pressure of 30 Pa. The polycrystalline silicon film has a thickness of approximately 0.5 µm, for example, and a sheet resistance of 20 mΩ/□. Etching is carried out by RIE using $CH_4$ (freon) based gas, for example.

Referring to the plan configuration of FIG. 8A and the cross-sectional configuration of FIG. 8B, an interlayer insulating film 143 and ohmic electrode 144 are formed on gate electrode 142. In the formation step P7 (FIG. 7) of interlayer insulating film 143, an $SiO_2$ film is deposited to a thickness of approximately 0.6 µm by CVD, for example, entirely on the surface of exposed gate electrode 142 of insulating gate type semiconductor device 100 in a fabrication process. Interlayer insulating film 143 may be formed by PCVD (Plasma Chemical Vapor Deposition) instead of CVD. Interlayer insulating film 143 may be made of silicon nitride (SiN).

Then, ohmic electrode 144 electrically connecting source region 134 and contact region 135 is formed. This ohmic electrode formation step (P8) involves source region 134 and contact region 135. An opening is formed in gate oxide film 141 and interlayer insulating film 143 so that first main face 137 of semiconductor layer 132 is exposed by photolithography and etching. Then, by electron beam deposition, titanium (Ti), Al and Si are sequentially deposited to a thickness of 200 nm, 400 nm and 250 nm, respectively, without removing the resist. Then, the Ti, Al, Si layers deposited on the resist are removed together with the resist (the so-called lift off method). Then, thermal treatment is carried out for 30 seconds at the temperature of approximately 950° C. in an inert atmosphere such as of argon (Ar) or N to form an alloy layer of the silicon carbide of semiconductor layer 132 and the Ti, Al, Si. The alloy layer is taken as ohmic electrode 144.

Figure 8K:
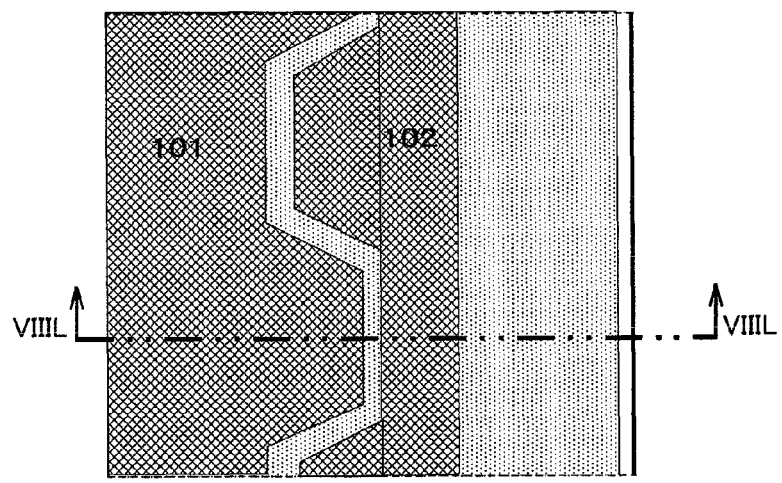
FIG. 8K is a top view at a point of time when an interconnection formation step is completed according to a method of fabricating a silicon carbide insulating gate type semiconductor device.
Figure 8L:
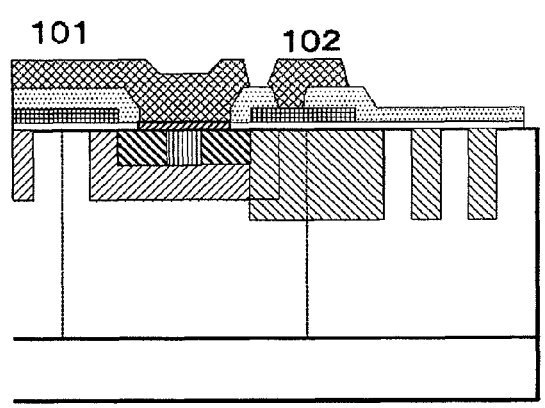
FIG. 8L is a schematic sectional view taken along line VIIIL-VIIIL of FIG. 8K.

Referring to the plan configuration of FIG. 8K and the cross-sectional configuration of FIG. 8L, source interconnection 101 and gate liner interconnection 102 electrically connected to ohmic electrode 144 in all the basic cells (110 or 120) and the gate electrode of each of basic cells located at the outermost circumference, respectively, are formed on interlayer insulating film 143. In this interconnection formation step P9 (FIG. 7), all basic cells (110 or 120) located at the outermost circumference are subjected to photolithography to have an opening formed in interlayer insulating film 143 on gate electrode 142 located on circumferential resurf region 105. Then, Al or Al alloy is provided by sputtering or the like to a thickness of approximately 2-5 µm after removing the resist. The Al or Al alloy is etched to form source interconnection 101 and gate liner interconnection 102. The etching of Al or Al alloy is allowed by RIE using chlorine (Cl) based gas.

Finally, a protection film of the organic type such as polymide, or such as of $SiO_2$ or SiN is formed (not shown) to complete silicon carbide insulating gate type semiconductor device 100 of the present embodiment.

It is to be understood that the embodiments disclosed herein are only by way of example, and not to be taken by way of limitation. The scope of the present invention is not limited by the description above, but rather by the terms of the appended claims, and is intended to include any modifications within the scope and meaning equivalent to the terms of the claims.

REFERENCE SIGNS LIST 100 insulating gate type semiconductor device; 101 source interconnection; 102 gate liner interconnection; 103 gate pad; 104 end face of semiconductor device; 105 circumferential resurf region; 106 first guard ring; 107 second guard ring; 108 active region; 110 quadrangle basic cell; 111 imaginary boundary line of quadrangle basic cell; 112 body region of quadrangle basic cell; 113 contact region of quadrangle basic cell; 114 source region of quadrangle basic cell; 120 hexagon shape basic cell; 121 imaginary boundary line of hexagon shape basic cell; 122 body region of hexagon shape basic cell; 123 contact region of hexagon shape basic cell; 124 source region of hexagon shape basic cell; 130 cross-sectional configuration of basic cell; 131 substrate; 132 semiconductor layer; 133 body region; 134 source region; 135 contact region; 136 anti-inversion region; 137 first main face of semiconductor layer; 137a first main face of semiconductor layer prior to oxidation step; 138 second main face of semiconductor layer; 141 gate oxide film; 142 gate electrode; 143 interlayer insulating film; 144 ohmic electrode; 145 channel region; 151 impurity concentration of semiconductor layer; 152 impurity concentration of body region; 153 impurity concentration of body region; 154 impurity concentration of semiconductor layer.

The invention claimed is:

1. A silicon carbide insulating gate type semiconductor device comprising:
   a support substrate,
   a semiconductor layer of a first conductivity type formed on said support substrate, and having a first main face opposite to a side of a face in contact with said support substrate, and
   an electrode and an interconnection formed on said main face,
   said semiconductor layer including an active region formed so as to include said first main face, and a circumferential resurf region formed in a strip so as to surround a circumference of said active region and to include said first main face,
   said active region having a plurality of basic cells surrounded by an imaginary boundary line constituting a polygon in plan view, arranged with no gap, so as to form contact at the boundary line,
   each of said plurality of basic cells including a body region of a second conductivity type constituting an analogue to said polygon at said main face,
   said circumferential resurf region of said second conductivity type being formed to include said body region in a basic cell constituting an outermost circumference in said active region, among said plurality of basic cells, and
   a width of a portion of said circumferential resurf region, excluding said body region, being greater than or equal to ½ a thickness of at least said semiconductor layer.

2. The silicon carbide insulating gate type semiconductor device according to claim 1, wherein
   an average impurity concentration of said second conductivity type circumferential resurf region is higher than the average impurity concentration of said second conductivity type body region, at a surface region of said semiconductor layer as far as a depth of 0.05 μm from said first main face.

3. The silicon carbide insulating gate type semiconductor device according to claim 1, wherein an average impurity concentration of said second conductivity type in said circumferential resurf region is greater than or equal to 3 times the average impurity concentration of said second conductivity type in said body region, at a surface region as far as a depth of 0.05 μm from said first main face.

4. The silicon carbide insulating gate type semiconductor device according to claim 1, wherein
   said body region has an impurity concentration of said second conductivity type varying so as to have a maximal value in a depth direction from said first main face,
   at a depth corresponding to said maximal value, the impurity concentration of said second conductivity type in said circumferential resurf region is less than or equal to ⅓ the maximal value of the impurity concentration in said body region.

5. The silicon carbide insulating gate type semiconductor device according to claim 1, wherein a depth of said circumferential resurf region from said first main face is greater than the depth of said body region from said first main face.

6. The silicon carbide insulating gate type semiconductor device according to claim 1, wherein said circumferential resurf region is of p conductivity type, and includes boron for impurity species.

7. The silicon carbide insulating gate type semiconductor device according to claim 1, wherein
   a circumference of said circumferential resurf region taking a strip shape in plan view constitutes a chamfered quadrangle having four corners rounded,
   a radius of a chamfered section of said circumference is greater than or equal to a thickness of said semiconductor layer.

8. The silicon carbide insulating gate type semiconductor device according to claim 1, wherein said semiconductor layer includes at least one guard ring surrounding said circumferential resurf region, and of said second conductivity type.

9. The silicon carbide insulating gate type semiconductor device according to claim 1, wherein
   said interconnection includes a gate liner interconnection arranged on said circumferential resurf region with an insulating film thereunder, made of metal, and having a strip shape,
   said electrode includes a gate electrode, and
   said gate liner interconnection is electrically connected to said gate electrode in each of basic cells located at the outermost circumference among said plurality of basic cells.

10. The silicon carbide insulating gate type semiconductor device according to claim 1, wherein
    said electrode includes a gate electrode,
    said semiconductor layer includes an anti-inversion region at substantially right below said gate electrode located at an overlapping region between said basic cell of the outermost circumference and said circumferential resurf region in plan view, including said first main face, and having an impurity concentration higher than the impurity concentration of said body region.

11. The silicon carbide insulating gate type semiconductor device according to claim 10, wherein
    each of said plurality of basic cells includes a contact region of said second conductivity type in said body region so as to include said first main face,
    said anti-inversion region is of said second conductivity type, and has an impurity concentration equal to the impurity concentration of said second conductivity type in said contact region.

12. The silicon carbide insulating gate type semiconductor device according to claim 1, wherein each of said plurality of basic cells has a shape of a hexagon in plan view.

13. The silicon carbide insulating gate type semiconductor device according to claim 1, wherein said first main face is inclined greater than or equal to 50° and less than or equal to 65° relative to a {0001} plane.

14. The silicon carbide insulating gate type semiconductor device according to claim 1, wherein said first main face is a {03-38} plane.

* * * * *